United States Patent [19]

Lockwood

[11] Patent Number: 5,033,108
[45] Date of Patent: Jul. 16, 1991

[54] SIGNAL REPEATER USING SHARED AMPLIFICATION WITH SELECTABLE INPUT/OUTPUT CONNECTIONS

[75] Inventor: Andrew S. Lockwood, Stevenage, England

[73] Assignee: British Aerospace Public Limited Company Limited, London, England

[21] Appl. No.: 383,770

[22] Filed: Jul. 24, 1989

[30] Foreign Application Priority Data

Aug. 17, 1988 [GB] United Kingdom ............... 8819501

[51] Int. Cl.$^5$ ............................................. H04B 7/185
[52] U.S. Cl. ........................................ 455/12; 455/17;
455/22; 455/103; 455/189; 333/101
[58] Field of Search ........................... 455/9, 12–13,
455/17, 127, 103, 189, 22; 340/825.06, 826;
330/295, 124 R, 124 D; 333/1.1, 101–102,
106–107; 370/75, 57

[56] References Cited

U.S. PATENT DOCUMENTS

| | | | |
|---|---|---|---|
| 3,808,566 | 4/1974 | Thompson et al. | 333/101 |
| 3,917,998 | 11/1975 | Welt, I | 455/13 |
| 4,618,831 | 10/1986 | Egami et al. | 330/295 |
| 4,706,239 | 11/1987 | Ito et al. | 455/12 |
| 4,858,229 | 8/1989 | Rosen et al. | 370/75 |
| 4,901,085 | 2/1990 | Spring et al. | 455/12 |

Primary Examiner—Reinhard J. Eisenzopf
Assistant Examiner—Andrew Faile
Attorney, Agent, or Firm—Cushman, Darby & Cushman

[57] ABSTRACT

A signal repeater assembly (1) for a spacecraft, includes a channel selectivity network (CSN) (2) having a plurality of first input ports (4–13) connected by selectively operable filter circuits (14–23) to a plurality of first output ports (24–31) to enable a signal at any selected first input port (4–13) to be passed to any selected first output port (24–31). The CSN (2) is connected to a shared power amplification module (SPAM) (3) having a plurality of second input ports (44–51) for receiving signals from the first output ports (24–31), a plurality of second output ports (52–59) and a network (60) of balanced amplifier devices (61) operable to couple the second input ports (44–51) to the second output ports (52–59) so that any amplification of a signal received at any one of the second input ports (44–51) is shared by all the amplifier devices (61) to allow the total available amplification power to be used by any one or a combination of second output ports (52–59).

6 Claims, 7 Drawing Sheets

EES COVERAGE

EUROPEAN MULTIPLE BEAM COVERAGE

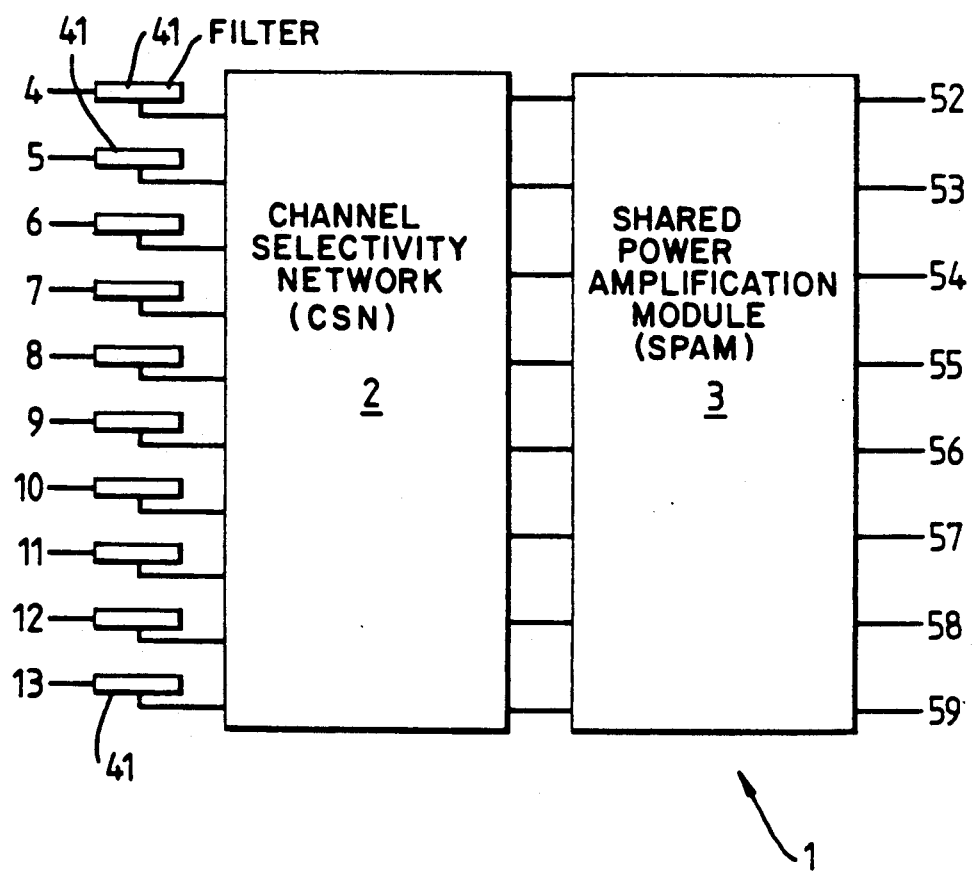

SIGNAL REPEATER USING SHARED AMPLIFICATION WITH SELECTABLE INPUT/OUTPUT CONNECTIONS

FIELD OF THE INVENTION

This invention relates to a signal repeater assembly for a spacecraft such as a communications satellite.

BACKGROUND OF THE INVENTION

A need has arisen for the payloads of spacecraft such as communications satellites to have greater signal traffic flexibility. This has been brought about by the increasing requirement for large numbers of coverage areas and hence antenna beams. This trend can be accounted for as follows:

1. Conventionally, satellites have generated large coverage areas on the Earth's surface using relatively small antennas on the satellite, due to limitations in the satellite technology. In order to increase the satellite's effective output power (EIRP—Effective Isotropic Radiated Power) and input sensitivity (G/T—Gain to noise temperature ratio) the satellite antenna gain can be increased resulting in a smaller beam. Many such beams are then used to provide the same total coverage of the Earth's surface as the original large beam. FIGS. 1(a) and (b) show examples of this conventional technique of multiple beam coverage.

2. The first generations of operational communications satellites were designed and used for international communications and essentially required almost global coverage. More recently, communications satellites have been employed by individual countries, or relatively small groups of countries, to provide domestic or intra-regional communications. Smaller coverage areas are needed for these applications.

However, the financial viability of domestic communications satellites is being called into question and there is now a tendency to 'pool' the resources of a communications satellite between several countries, with the ability to 'reconfigure' the resources within the satellite to serve one or other of the countries at different times during the satellite's lifetime. This gives rise to the need for many separate antenna beams, with an uncertain allocation of satellite resources (bandwidth and power) between those beams.

Another trend, linked to the above use of many smaller antenna beams, is for communications satellites to be larger and to carry a large number of transponders (up to fifty). This results in the need to be able flexibly to connect (switch, etc) up to fifty transponders between, say, twenty to forty antenna beams.

Satellite lifetimes have evolved over the last twenty years from two to three years to ten to fifteen years. The ability to accurately predict the exact traffic requirements this far in advance (plus the three year satellite construction period) is becoming a major problem.

Two further relevant factors are:

1. The trend towards using small Earth stations is the result of trading-off the relative costs of the satellite and the Earth stations in a total system. To make the Earth station smaller and less expensive and so to allow such Earth stations to proliferate, involves less efficient use of the satellite resource. In particular, this means using more satellite power per link than would be necessary for operation with a larger Earth station. This inevitably means that the satellite 'transponder' is operating in a 'power limited' mode and actually has more bandwidth available than it can usefully use.

2. Small and cheap Earth stations also encourage the use of SCPC (Single Channel Per Carrier) mode of operation which means that there are many carriers simultaneously present within the same satellite transponder bandwidth. Each carrier will support its group of Earth stations. To avoid intermodulation distortion dominating the performance of the links, the satellite HPA (High Power Amplifier) has to be operated in a linear mode, commonly called 'backed-off'.

It has been proposed to meet these requirements and trends by providing conventional switching networks in a communications satellite between the high power amplifiers (HPA's) and the transmit antenna beam ports but this will severely limit the satellite operating capability and signal traffic flexibility by the large mass, great size, great complexity and high power loss of such conventional switching networks.

OBJECTS OF THE INVENTION

One object of the present invention is to provide a generally improved signal repeater assembly for a spacecraft which minimizes the above detailed mass, size, complexity and power loss problems.

Another object of the present invention is to provide a signal repeater assembly which affords improved operating flexibility to a spacecraft such as a communications satellite fitted therewith.

These and other objects and advantages of the present invention will become more apparent from details disclosed in the following description where preferred embodiments of the invention are disclosed.

SUMMARY OF THE INVENTION

According to one aspect of the present invention there is provided a signal repeater assembly for a spacecraft, including a channel selectivity network (CSN) having a plurality of first input ports connected by selectively operable filter circuits to a plurality of first output ports and operable to enable a signal at any selected first input port to be passed to any selected first output port, and a shared power amplification module (SPAM) having a plurality of second input ports for receiving signals from the first output ports, a plurality of second output ports and a network of balanced amplifier devices operable to couple the second input ports to the second output ports in a manner such that any amplification of a signal received at any one of the second input ports is shared by all the amplifier devices to allow the total available amplification power to be used by any one or a combination of second output ports.

Advantageously the channel selectivity network has 'n' filter circuits each made up of one or more 2 pole 2 way on/off switches series connected via one pole of said one or more switches to an associated one of the first input ports and 'm' output lines each series connecting the other pole of one switch of one or more of the filter circuits to an associated one of the first output ports.

Preferably each filter circuit includes a band pass filter via which the or each switch in the circuit is connected to the associated first input port, so that signals received, in operation of the assembly, at the first input ports are combined and transmitted to the second input ports with a desired relative amplitude to equalise the differences in pass loss between the filter circuits and to provide desired power levels at the second input ports.

Conveniently 'n' is greater in value than 'm'.

Advantageously the effective amplifying power of the shared power amplification module is the sum of the amplifying powers of the individual amplifier devices.

Preferably each amplifier device is a balanced amplifier in which two said second input ports are coupled via a first 90° hybrid coupler to two amplifier means whose outputs are coupled via a second 90° hybrid coupler to two of said second output ports, so that a signal supplied to one said second input port from one said first output port will be transmitted to the diagonally opposite second output port.

Conventionally the shared power amplification module network includes a plurality of balanced amplifier devices having a nested configuration wherein additional 90° hybrid couplers are provided between the second input ports and the first couplers and between the second couplers and the second output ports.

According to another aspect of the present invention there is provided a communications satellite including a signal repeater assembly as hereinbefore described.

The combination of channel selectivity network (CSN) and shared power amplification module (SPAM) is particularly suitable for use in a communications satellite where previously it was necessary to employ a number of fixed power, fixed traffic capacity transponders which were directed to the required coverage antenna beam. The CSN now allows the individual signals or channels to be distributed to the input ports of the SPAM and the SPAM amplifies the signals being passed to each output port of the SPAM independently, making optimum use of the available amplifying power.

The SPAM also forms the subject of our copending U.S. Pat. application Ser. No. 07/383,771 filed Jul. 24, 1989.

DESCRIPTION OF THE DRAWINGS

For a better understanding of the present invention, and to show how the same may be carried into effect, reference will now be made, by way of example, to the accompanying drawings, in which:

FIG. 10 is a block diagram of a signal repeater assembly of the invention.

DESCRIPTION OF EMBODIMENTS OF THE INVENTION

Figure 1A:
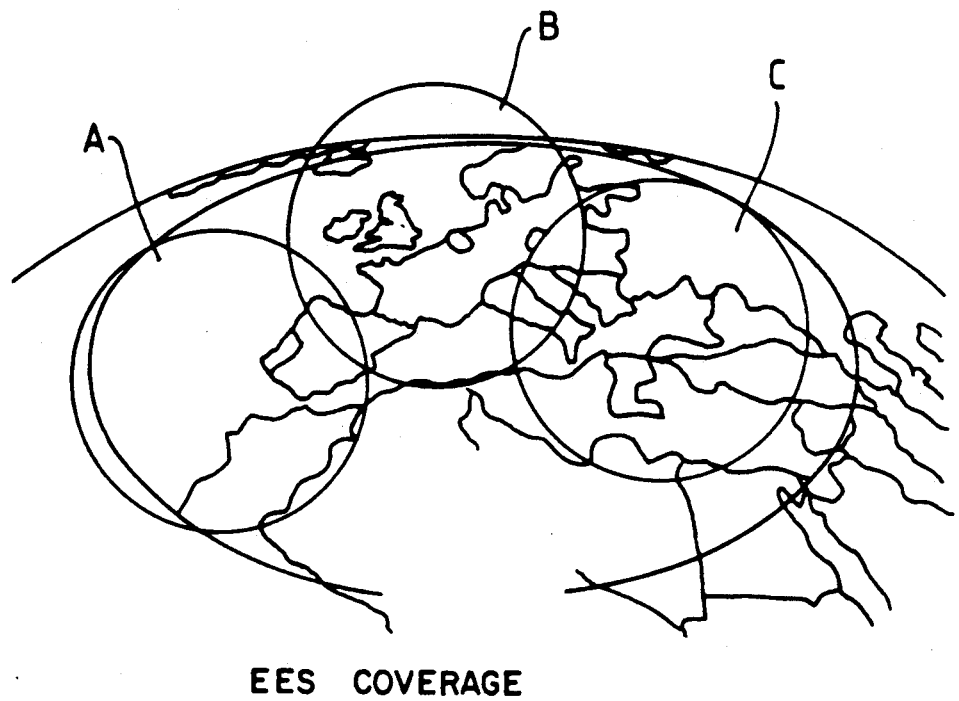
FIG. 1(a) is a schematic view of a conventional technique of multiple beam coverage showing the use of three spot beams A, B and C.
Figure 1B:
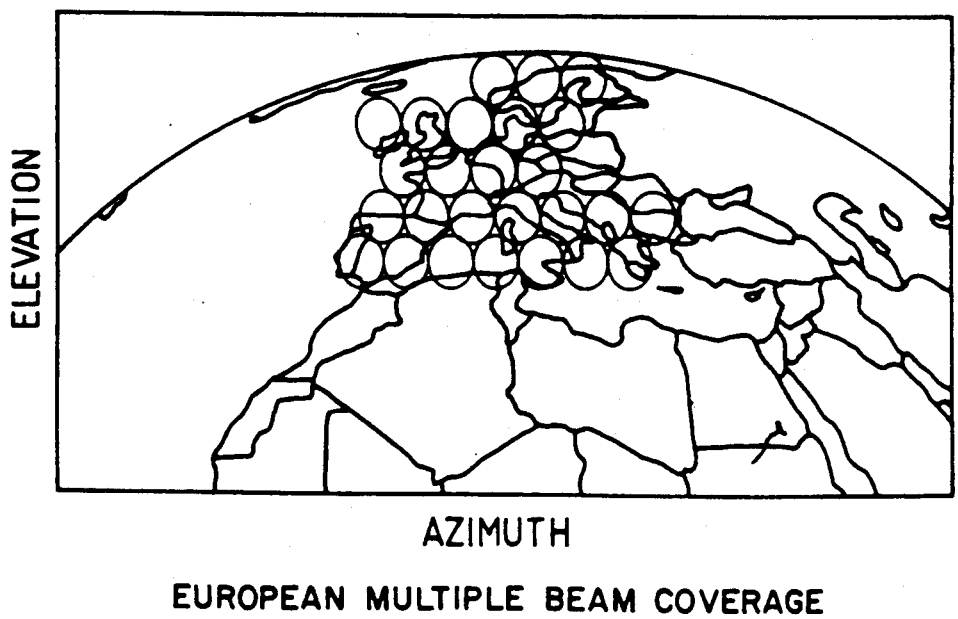
FIG. 1(b) is a view of a conventional technique similar to that of FIG. 1(a) but to a smaller scale and using more spot beams.

A signal repeater assembly of the invention, generally referenced 1 in FIG. 10 of the accompanying drawings, is intended for use in a spacecraft and will be described hereinafter by reference to use in a spacecraft in the form of a communications satellite. The assembly 1 basically comprises a channel selectivity network (CSN) generally referenced 2 and a shared power amplification module (SPAM) generally referenced 3.

The CSN has a plurality of first input ports 4 to 13 connected by selectively operable filter circuits 14 to 23 to a plurality of first output ports 24 to 31. The CSN is operable to enable a signal at any selected input port 4 to 13 to be passed to any selected output port 24 to 31. The CSN has 'n' filter circuits 14 to 23 each made up of one or more 2 pole 2 way on/off switches 32 series connected via one pole 32a to an associated one of the input ports 4 to 12, and 'm' output lines 33 to 40 each series connecting the other pole 32b of one switch 32 of one or more of the filter circuits 14 to 22 to an associated one of the output ports 24 to 31.

Figure 2A:
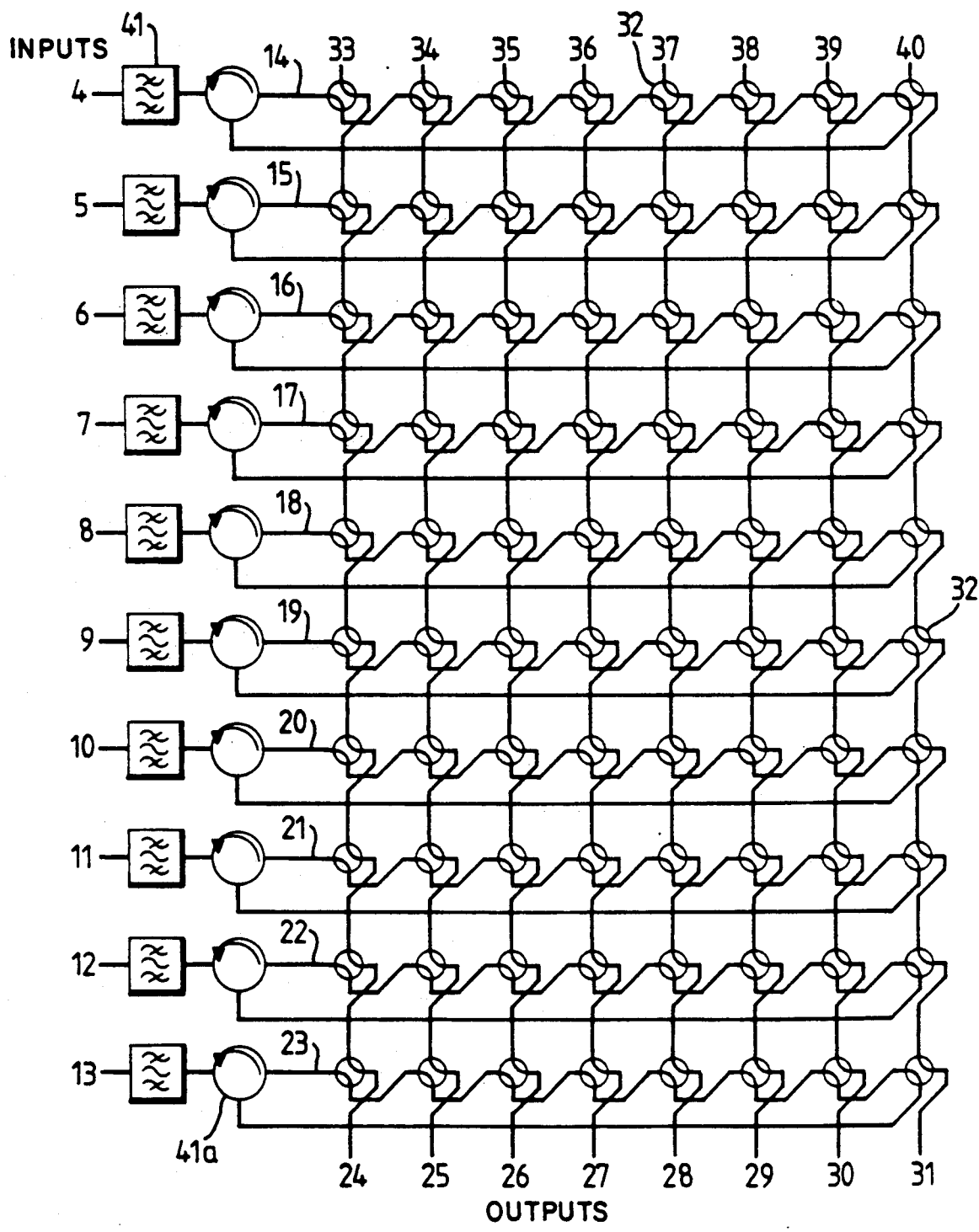
FIG. 2(a) is a diagrammatic view of one example of a channel selectivity network (CSN) for use in a signal repeater assembly of the invention.
Figure 2B:
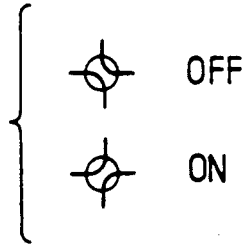
FIG. 2(b) is a schematic view showing a switch of the network of FIG. 2(a) in "off" and "on" positions as applicable to FIGS. 3 and 4 also.

Preferably 'n' is greater than 'm' and as shown in FIG. 2(a) 'n' = 10 whilst 'm' = 8. However 'n' and 'm' can have any desired values as long as n and m are both integers greater than or equal to 2, and in the FIG. 4 CSN 'n' = 9 and 'm' = 8. Each filter circuit 14 to 22 includes a band pass filter 41 and circulator 41a via which the or each switch 32 in the circuit is connected to the associated input port 4 to 12.

Figure 3A:
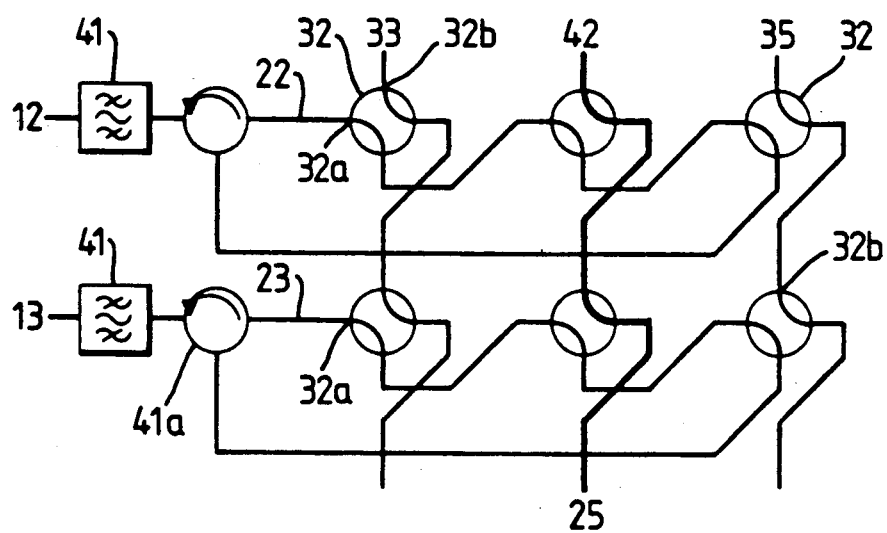
FIG. 3(a) shows to an enlarged scale a section of the CSN of FIG. 2(a) showing in heavy lines the transmission path of a signal down an output line from one filter circuit to the next with no signals added.
Figure 3B:
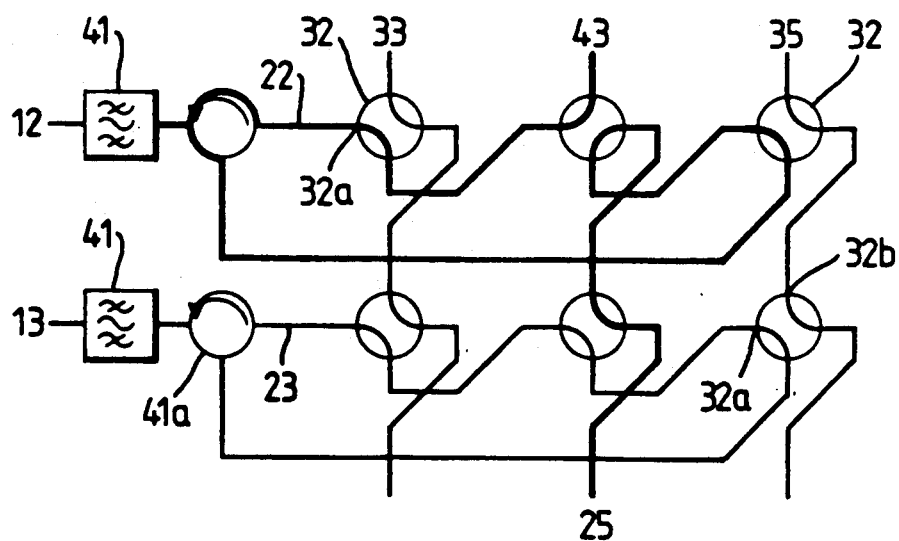
FIG. 3(b) is a view similar to that of FIG. 3(a) showing in heavy lines the transmission path of a signal which is added to a signal incoming to one filter circuit and passed on to the next filter circuit.

In conventional payload terms, the CSN 2 carries out the demultiplexing, channel connectivity switching and the multiplexing functions. The basic configuration of the CSN is shown in FIG. 2(a). This example shows how 10 channels can be distributed to an 8 port SPAM. In the primary or "off" mode, the switches 32 are all set such that none of the filter circuits and hence signals are connected to the outputs 24 to 31. When a particular signal is required to be transmitted to an output, the switch 32 which intersects the circuit carrying the signal and the line connected to the output is set to the "on" position. It is not possible to set more than one switch in any circuit to the "on" position, but any number of switches in a line can be set "on". Both of these modes are shown in FIG. 3(a) and FIG. 3(b) with the signal paths indicated in heavy line. In FIG. 3(a) a signal enters a line at 42 from a previous circuit and exits at port 25 with no further signal added. In FIG. 3(b) a signal enters a line at 43 from a previous circuit and exits at port 25 having been combined in filter circuit 22 with a signal entering the circuit 22 at input 12.

Figure 4:
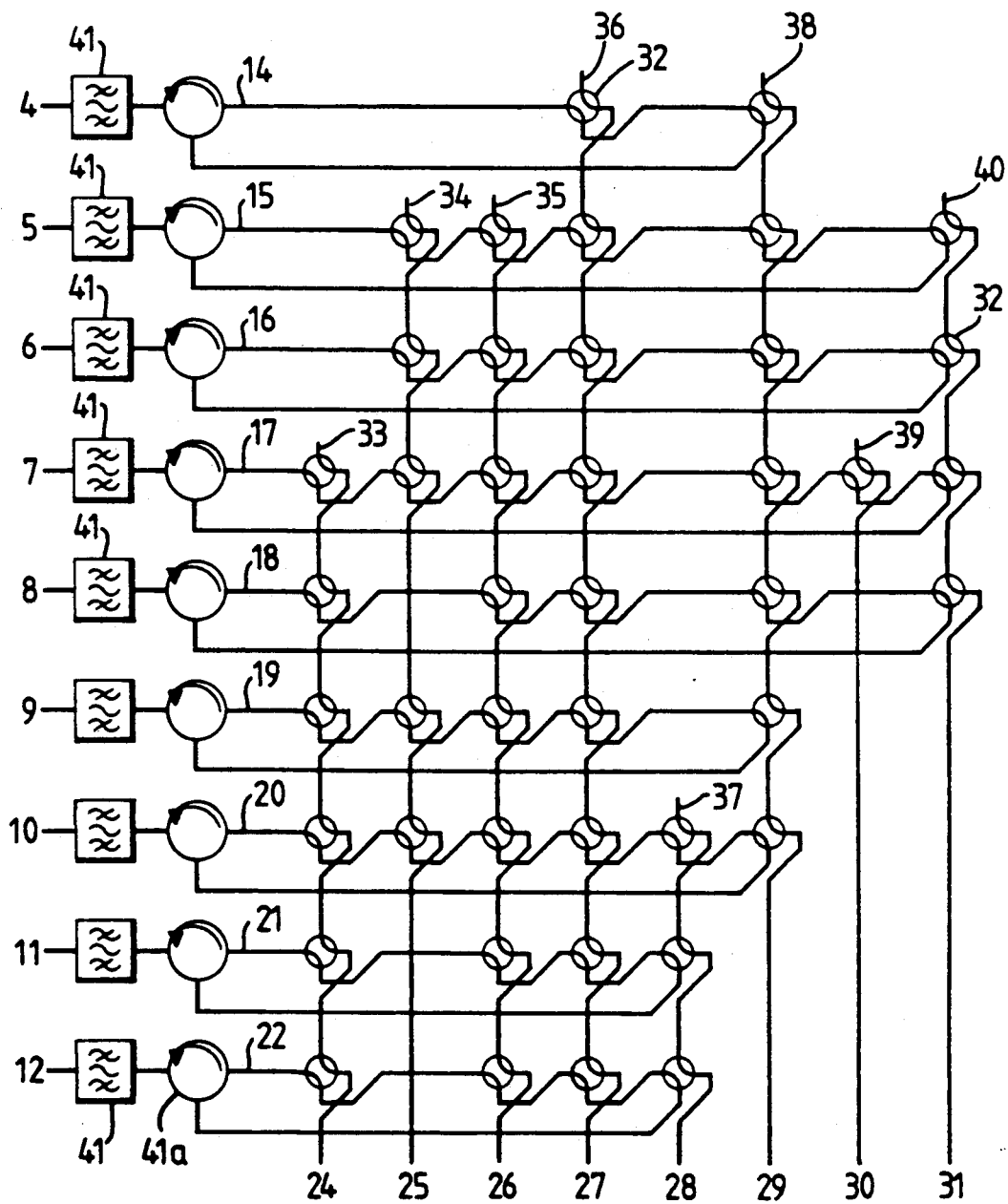
FIG. 4 is a diagrammatic view of a simplified CSN for use in a signal repeater assembly of the invention.

The size of the CSN depends upon the number of circuits available and the number of outputs to which these circuits must be directed. If it will never be necessary for a signal to be directed to a particular output, then the switch 32 intersecting the relevant circuit and line can be removed and by passed. An example of this is shown in FIG. 4.

Figure 5:
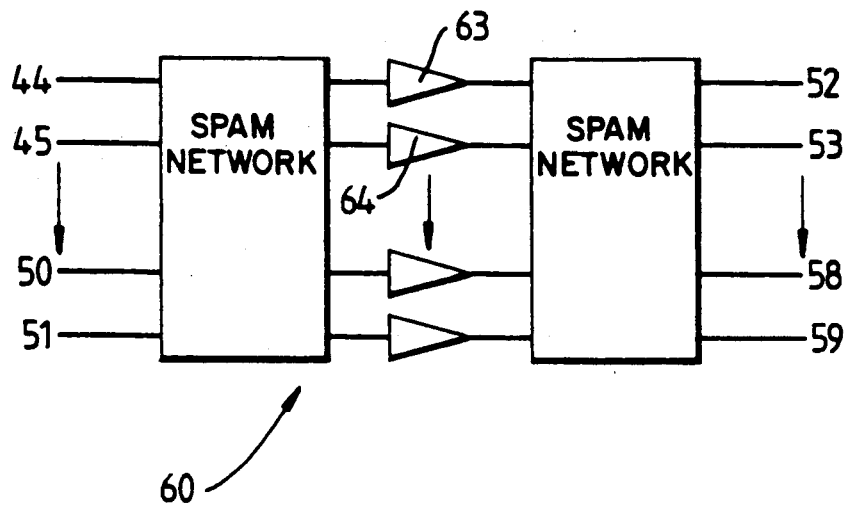
FIG. 5 is a block diagram showing a general form of shared power amplification module (SPAM) for use in a signal repeater assembly of the invention.

The SPAM 3 has a plurality of second input ports 44 to 51 for receiving signals from the first output ports 24 to 31 of the CSN 2, a plurality of second output ports 52 to 59 and a network 60 (see FIG. 5) of balanced amplifier devices 61 (see FIG. 6) operable to couple the input ports 44 to 51 to the output ports 52 to 59. The SPAM operates so that any amplification of a signal received at any one of the input ports 44 to 51 from the CSN output ports 24 to 31 is shared by all the amplifier devices 61 to allow the total available amplification power to be used by any one or a combination of second output ports 52 to 59.

Thus the SPAM 3 is a large number of amplifiers connected in such a way that they act as single amplifier with more than one input and output. The effective power of the SPAM is the sum of the powers of the individual amplifier devices 61 as shown schematically in FIG. 5.

Figure 6:
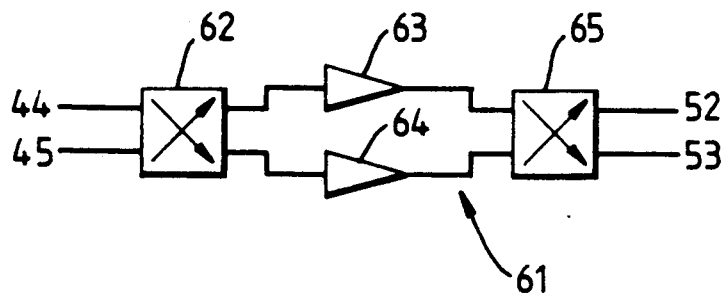
FIG. 6 is a diagram of a balanced amplifier device forming part of a SPAM for use in a signal repeater assembly of the invention.
Figure 7:
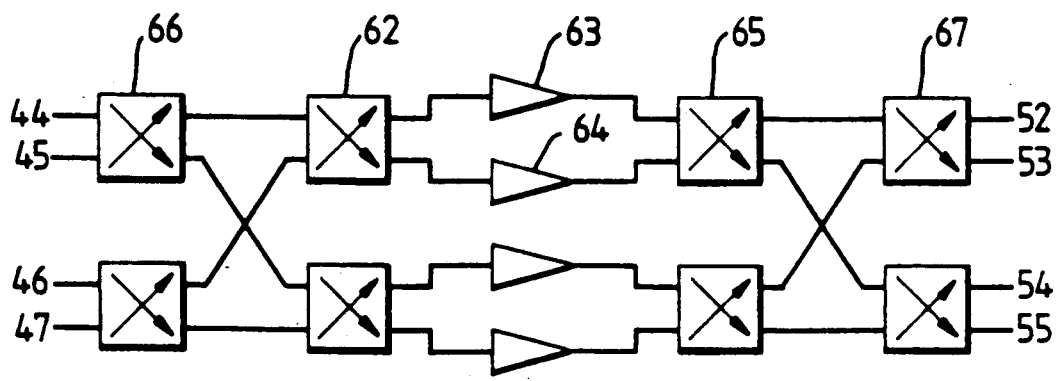
FIG. 7 is a nested balanced amplifier device forming part of a SPAM for use in a signal repeater assembly of the invention.

The SPAM 3 is built up from several smaller elements combined in parallel, the smallest of these being a 2 port SPAM shown in FIG. 6, more commonly called a balanced amplifier device 61. A 4 port SPAM is two of these combined in parallel as shown in FIG. 7. This technique can be extended by combining SPAMs of successively higher order and an 8 port device is shown in FIG. 8.

Each balanced amplifier device 61 has two second input ports 44,45 coupled via a first 90° hybrid coupler 62, preferably a 3 dB coupler, to two amplifier means 63,64 whose outputs are coupled via a second 90° hybrid coupler 65 to two second output ports 52,53, so that a signal applied to one second input port 44 is transmitted to the diagonally opposite second output port 53.

Figure 8:
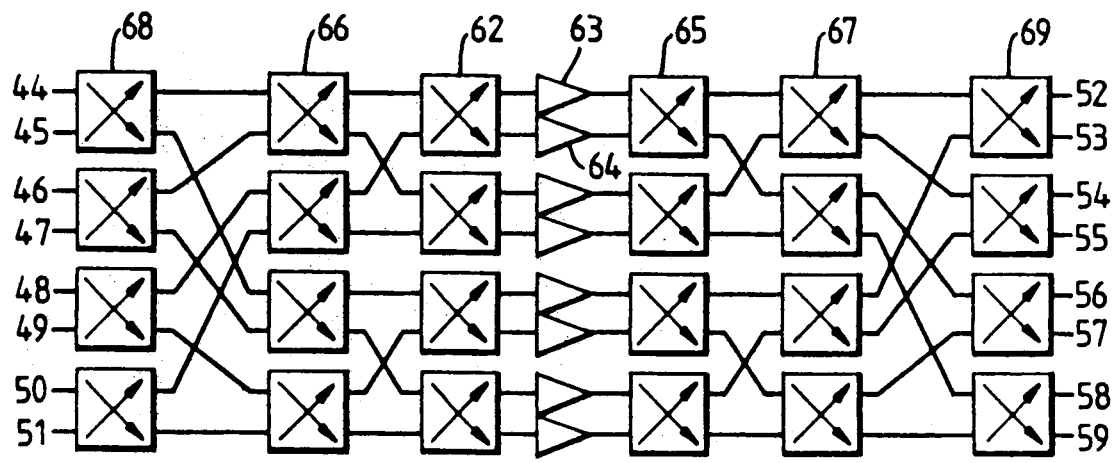
FIG. 8 is a view similar to that of FIG. 7 showing an 8 port 8 stage SPAM.
Figure 9:
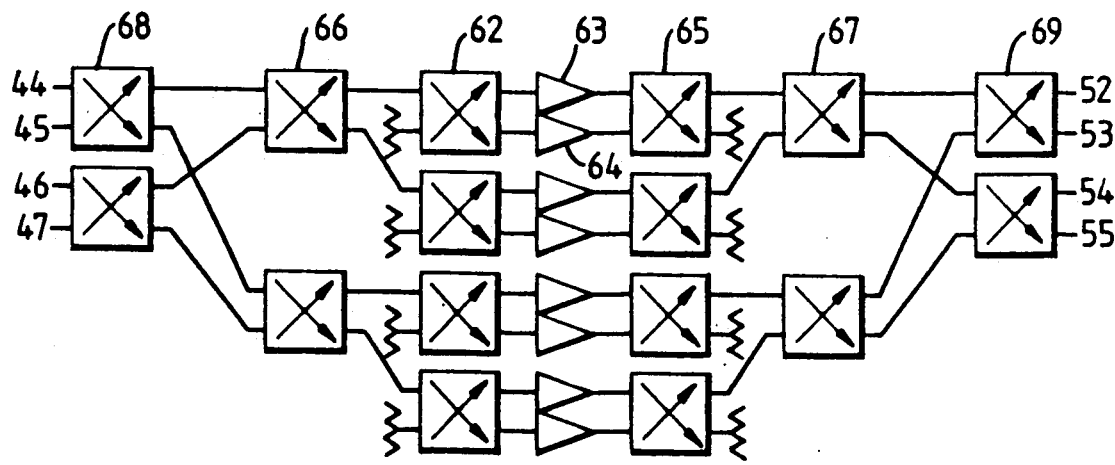
FIG. 9 is a view similar to that of FIG. 8 showing a 4 port 8 stage SPAM.

The SPAM network may include a plurality of balanced amplifier devices 61 having a nested configuration such as shown in FIGS. 7, 8 and 9. In these examples additional 90° hybrid couplers 66 to 69 are provided between the second input ports 44 to 51 and the first couplers 62 and between the second couplers 65 and the second output ports 52 to 59.

Signals injected into any input port 44 to 51 are divided by the hybrid couplers 62,66,68 network and pass through every amplifier 63,64 in the device. The output network hybrid couplers 65,67,69 then cause the components of each signal to recombine and appear at the corresponding output port 52–59. Signals injected into each port are amplified by a fixed gain, therefore a difference in the input levels of the signals will result in a corresponding difference in output levels. In this way the total available power of the payload can be used optimally.

If more amplifiers than ports are required, then the network can be 'pruned' by removing unused hybrid couplers as required. FIG. 9 shows a four-port, eight amplifier SPAM.

A flexible repeater configuration is formed by combining the CSN and SPAM in series as shown schematically in FIG. 10. A series of band pass filters 41 have been included at the input to the CSN. This is to ensure that the signals are combined and transmitted to the SPAM section 3 with the correct relative amplitude. This serves two purposes, firstly to equalize the differences in path loss from one channel to the next and secondly to create the required relative power levels at the input to the SPAM 3.

Reductions or increases in the number of channels and/or output ports can be dealt with individually as already explained.

Thus the SPAM is a means by which the total radio frequency power available on a satellite can be shared in any ratio between the signals passing through the satellite and not in fixed amounts of, say, 50 watts as has previously been necessary. It is basically a means of flexibly allocating the power resource of the satellite.

The CSN is a means of flexibly allocating frequency to the different channels of the satellite and not in fixed amounts of, say 72 MHz as has previously been necessary. It is basically a means of flexibly allocating the bandwidth resource of the satellite.

Hence as a communications satellite has essentially only the two resources of bandwidth and power to offer to communications users, the combination of SPAM and CSN allows these two resources to be allocated more flexibly and at a lower hardware cost than has previously been possible.

Various modifications and alterations may be made to the embodiments of the present invention described and illustrated, within the scope of the present invention as defined in the following claims.

What is claimed is:

1. A signal repeater assembly for a spacecraft, including a channel selectivity network (CSN) having a plurality of first input ports connected by selectively operable filter circuits to a plurality of first output ports and operable to enable a signal at any selected first input port to be passed to any selected first output port, and a shared power amplification module (SPAM) having a plurality of second input ports for receiving signals from the first output ports, a plurality of second output ports and a network of balanced amplifier devices operable to couple the second input ports to the second output ports in a manner such that any amplification of a signal received at any one of the second input ports is shared by all the amplifier devices in a way such that a total available amplification power of said network of balanced amplifier devices is used by any one or a combination of second output ports, wherein the channel selectivity network has 'n' of said selectively operable filter circuits (wherein n is an integer greater than or equal to 2), each including one or more 2 pole 2 way on/off switches series connected via one pole of said one or more switches to an associated one of the first input ports and 'm' output lines (wherein m is an integer greater than or equal to 2) each series connecting the other pole of one switch of one or more of the filter circuits to an associated one of the first output ports.

2. An assembly according to claim 1, wherein each filter circuit further includes a band pass filter, connecting each of said one or more switches to said associated first input port, so that signals received, in operation of the assembly, at the first input ports are combined and transmitted to the second input ports with a desired relative amplitude to equalize the differences in path loss between the filter circuits and to provide desired power levels at the second input ports.

3. An assembly according to claim 2, wherein 'n' is greater in value than 'm'.

4. An assembly according to claim 3, wherein the effective amplifying power of the shared powers amplification module is the sum of the amplifying power of the individual amplifier devices.

5. An assembly according to claim 4, wherein each balanced amplifier device is such that said two second input ports are coupled via a first 90° hybrid coupler to two amplifier means whose outputs are coupled via a second 90° hybrid coupler to two of said second output ports, so that a signal supplied to one said second input port from one said first output port will be transmitted to the diagonally opposite second output port.

6. An assembly according to claim 5, in which the shared power amplification module network includes a plurality of balanced amplifier devices having a nested configuration wherein additional 90° hybrid couplers are provided between the second input ports and the first couplers and between the second couplers and the second output ports.

* * * * *